US009406371B1

(12) United States Patent
Yoon

(10) Patent No.: US 9,406,371 B1
(45) Date of Patent: Aug. 2, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Young Jun Yoon, Icheon-si (KR)

(73) Assignee: SK hynix Inc., Incheon-si, Gyeonggi-do (KR)

( * ) Notice: Subject to any disclaimer, the term of this patent is extended or adjusted under 35 U.S.C. 154(b) by 0 days.

(21) Appl. No.: 14/716,995

(22) Filed: May 20, 2015

(30) Foreign Application Priority Data

Jan. 27, 2015 (KR) ........................ 10-2015-0012944

(51) Int. Cl.
*G11C 7/22* (2006.01)
*G11C 11/409* (2006.01)
*G11C 7/10* (2006.01)
*G11C 8/10* (2006.01)

(52) U.S. Cl.
CPC ............ *G11C 11/409* (2013.01); *G11C 7/1057* (2013.01); *G11C 7/1063* (2013.01); *G11C 7/1066* (2013.01); *G11C 7/1072* (2013.01); *G11C 7/222* (2013.01); *G11C 8/10* (2013.01)

(58) Field of Classification Search
CPC .................................. G11C 7/22; G11C 7/222
USPC .......................................... 365/189.05, 233.5
See application file for complete search history.

(56) References Cited

U.S. PATENT DOCUMENTS 6,052,329 A * 4/2000 Nishino ............... G11C 7/1051 365/189.05
6,353,573 B1 * 3/2002 Koshikawa .......... G11C 7/1072 365/194
8,599,624 B2 * 12/2013 Koshizuka ........... G11C 7/1051 365/189.07
8,867,252 B2 * 10/2014 Koshizuka ........... G11C 7/1051 365/193
9,082,482 B2 * 7/2015 Koshizuka ........... G11C 7/1051
2013/0215691 A1 8/2013 Koshizuka

FOREIGN PATENT DOCUMENTS

KR 20070119378 A 12/2007

* cited by examiner

*Primary Examiner* — Michael Tran
(74) *Attorney, Agent, or Firm* — William Park & Associates Ltd.

(57) ABSTRACT

A semiconductor device includes an output controller and a data strobe signal generator. The output controller generates a period signal and a control clock signal according to a read operation signal generated to execute a read operation, an internal clock signal generated in synchronization with a clock signal, and an expansion control signal. The data strobe signal generator generates a data strobe signal according to the control clock signal during a period that the period signal is enabled. The period that the period signal is enabled expands according to the expansion control signal.

20 Claims, 14 Drawing Sheets

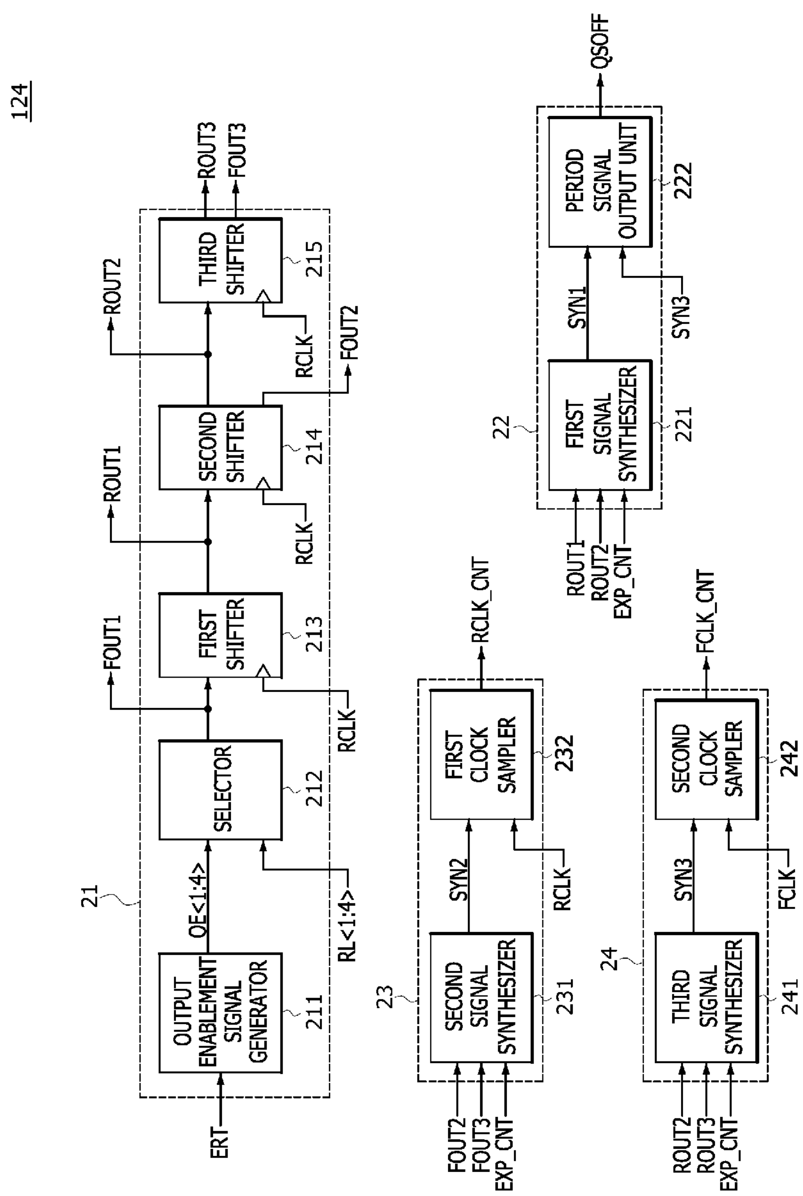
FIG.2
124
21
OUTPUT ENABLEMENT SIGNAL GENERATOR
211
ERT
OE<1:4>
SELECTOR
212
RL<1:4>
FIRST SHIFTER
213
SECOND SHIFTER
214
THIRD SHIFTER
215
RCLK
FOUT1
ROUT1
ROUT2
FOUT2
ROUT3
FOUT3
22
FIRST SIGNAL SYNTHESIZER
221
PERIOD SIGNAL OUTPUT UNIT
222
SYN1
SYN3
QSOFF
ROUT1
ROUT2
EXP_CNT
23
SECOND SIGNAL SYNTHESIZER
231
FIRST CLOCK SAMPLER
232
SYN2
RCLK
RCLK_CNT
FOUT2
FOUT3
EXP_CNT
24
THIRD SIGNAL SYNTHESIZER
241
SECOND CLOCK SAMPLER
242
SYN3
FCLK
FCLK_CNT
ROUT2
ROUT3
EXP_CNT

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Application No. 10-2015-0012944, filed on Jan. 27, 2015, in the Korean Intellectual Property Office, which is incorporated herein by reference in its entirety as set forth in full.

BACKGROUND

1. Technical Field

Embodiments of the invention relate to semiconductor devices having a stable output period of a data strobe signal and semiconductor systems including the same.

2. Related Art

Semiconductor memory devices have been continuously developed to improve the operation speed thereof with increase of their integration density. For example, synchronous memory devices operating in synchronization with external clock signals have been revealed to improve the operation speed thereof.

Single data rate (SDR) synchronous memory devices have been first proposed to enhance the operation speed of the semiconductor memory devices. The SDR synchronous memory devices receive or output the data in synchronization with every rising edge of an external clock signal.

However, high performance memory devices, which are faster than the SDR synchronous memory devices, are still required to meet the requirements of high performance electronic systems. Accordingly, double data rate (DDR) synchronous memory devices operating at a higher speed than SDR synchronous memory devices have been proposed recently. The DDR synchronous memory devices may receive or output the data twice during a single cycle time of an external clock signal. That is, the DDR synchronous memory devices may receive or output the data in synchronization with every rising edge and every falling edge of the external clock signal. Thus, the DDR synchronous memory devices may operate at a speed which is twice higher than that of the SDR synchronous memory devices even without increase of a frequency of the external clock signal.

In a semiconductor system, a data strobe signal may be used for data exchange between semiconductor devices in the semiconductor system or between a semiconductor device and a controller in the semiconductor system. The data strobe signal may be transmitted with data through a data transmission line. Thus, transmission of the data strobe signal and the data may be affected by a signal delay time of the data transmission line. Accordingly, if the data are inputted or outputted in synchronization with the data strobe signal, the data may be stably inputted to or outputted from the semiconductor system.

SUMMARY

According to an embodiment, there is provided a semiconductor system. The semiconductor system includes a controller and a semiconductor device. The controller generates a command signal and a clock signal. The semiconductor device generates a period signal that sets an output period that a data strobe signal is outputted while a read operation is executed according to the command signal. In addition, the semiconductor device generates a control clock signal from which the data strobe signal is obtained during the output period. The output period expands according to an expansion control signal.

According to an embodiment, there is provided a semiconductor device. The semiconductor device includes an output controller and a data strobe signal generator. The output controller receives a read operation signal generated to execute a read operation, an internal clock signal generated in synchronization with a clock signal, and an expansion control signal to generate a period signal and a control clock signal. The data strobe signal generator generates a data strobe signal according to the control clock signal during a period that the period signal is enabled. The period that the period signal is enabled expands according to the expansion control signal.

In an embodiment, a semiconductor system includes a controller configured to decode a command signal to generate a read operation signal. The semiconductor system also includes a semiconductor device configured to receive the read operational signal to generate a period signal, a first control clock signal and a second control clock signal and a first data strobe signal and a second data strobe signal in synchronization with the first and second control clock signals during an output period in which the period signal is enabled.

BRIEF DESCRIPTION OF THE DRAWINGS

FIG. 2 is a block diagram illustrating an output controller included in the semiconductor system of FIG. 1;

DETAILED DESCRIPTION

Various embodiments of the invention will be described hereinafter with reference to the accompanying figures. However, various embodiments described are for illustrative purposes only and are not intended to limit the scope of the invention. Various embodiments are directed to semiconductor devices having a stable output period of a data strobe signal and semiconductor systems including the same.

Figure 1:
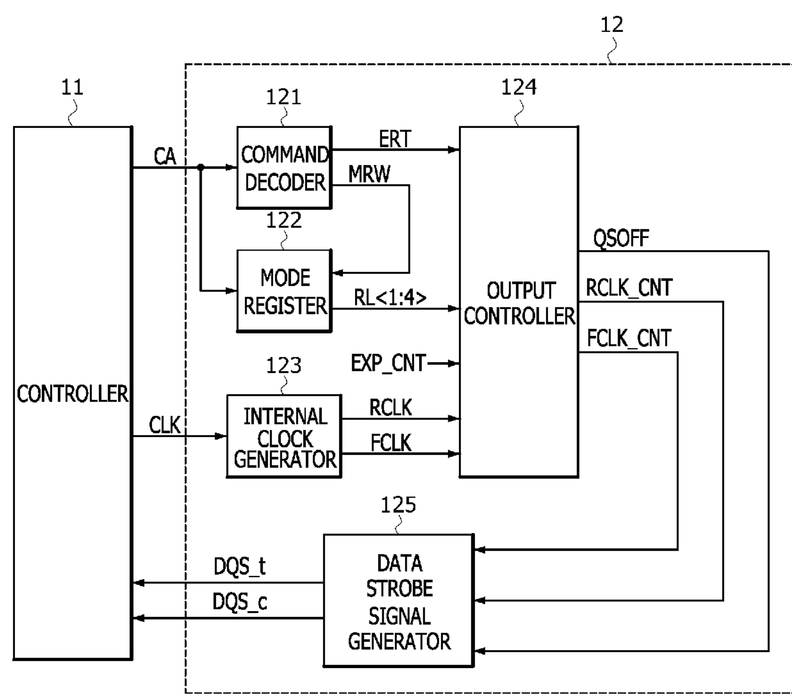
FIG. 1 is a block diagram illustrating a semiconductor system according to an embodiment.

Referring to FIG. 1, a semiconductor system according to an embodiment may include a controller 11 and a semiconductor device 12. The semiconductor device 12 may include a command decoder 121, a mode register 122, an internal clock generator 123, an output controller 124 and a data strobe signal generator 125.

The controller 11 may generate a command signal and an address signal. The controller 11 may also apply at least one of the command signal and the address signal to the semiconductor device 12 through a command/address line CA. In addition, the controller 11 may generate a clock signal CLK. The controller 11 may also apply the clock signal CLK to the semiconductor device 12.

The command decoder 121 may receive the command signal from the controller 11 through the command/address line CA. The command decoder 121 may also decode the command signal to generate a read operation signal ERT and a mode register write signal MRW. The read operation signal ERT may be enabled to execute a read operation. Further, the mode register write signal MRW may be enabled to store information in the mode register 122.

If the mode register write signal MRW is enabled, the mode register 122 may extract first to fourth read latency signals RL<1:4> from a signal inputted thereto through the command/address line CA. Further, the mode register 122 may also store the first to fourth read latency signals RL<1:4> therein. The mode register 122 may output the first to fourth read latency signals RL<1:4> to the output controller 124.

The internal clock generator 123 may receive the clock signal CLK from the controller 11 to generate a first internal clock signal RCLK and a second internal clock signal FCLK. The first internal clock signal RCLK may be generated in synchronization with a rising edge of the clock signal CLK. Further, the second internal clock signal FCLK may be generated in synchronization with a falling edge of the clock signal CLK.

The output controller 124 may receive the read operation signal ERT, the first to fourth read latency signals RL<1:4>, an expansion control signal EXP_CNT, the first internal clock signal RCLK and the second internal clock signal FCLK to generate a period signal QSOFF, a first control clock signal RCLK_CNT and a second control clock signal FCLK_CNT. The period signal QSOFF may set an output period that the first and second control clock signals RCLK_CNT and FCLK_CNT are generated. The output period may be set to be a period that the period signal QSOFF is enabled. The output period may also be expanded if the expansion control signal EXP_CNT is enabled. For example, the output period of the first and second control clock signals RCLK_CNT and FCLK_CNT may be set to more expand by one cycle time of the first internal clock signal RCLK in the case that the expansion control signal EXP_CNT is enabled than when the expansion control signal EXP_CNT is disabled.

The data strobe signal generator 125 may generate a first data strobe signal DQS_t and a second data strobe signal DQS_c in synchronization with the first and second control clock signals RCLK_CNT and FCLK_CNT during the output period that the period signal QSOFF is enabled. A level of the first data strobe signal DQS_t may change from a logic "low" level to a logic "high" level in synchronization with the first control clock signal RCLK_CNT. A level of the first data strobe signal DQS_t may also change from a logic "high" level to a logic "low" level in synchronization with the second control clock signal FCLK_CNT. The second data strobe signal DQS_c may be generated to have an inversed phase of the first data strobe signal DQS_t.

Referring to FIG. 2, the output controller 124 may include an output signal generator 21, a period signal generator 22, a first control clock generator 23 and a second control clock generator 24.

The output signal generator 21 may include an output enablement signal generator 211, a selector 212, a first shifter 213, a second shifter 214 and a third shifter 215. The output enablement signal generator 211 may generate first to fourth output enablement signals OE<1:4> sequentially shifted in response to the read operation signal ERT. A detailed configuration and a detailed operation of the output enablement signal generator 211 will be described with reference to FIGS. 3 and 4 later. The selector 212 may selectively output any one of the first to fourth output enablement signals OE<1:4> as a first falling output signal FOUT1 in response to the first to fourth read latency signals RL<1:4>. For example, the selector 212 may selectively output the first output enablement signal OE<1> as the first falling output signal FOUT1 if the first read latency signal RL<1> is enabled. Further, the selector 212 may selectively output the second output enablement signal OE<2> as the first falling output signal FOUT1 if the second read latency signal RL<2> is enabled. The first shifter 213 may shift the first falling output signal FOUT1 by one cycle time of the first internal clock signal RCLK to generate a first rising output signal ROUT1. The second shifter 214 may shift the first rising output signal ROUT1 by a half cycle time of the first internal clock signal RCLK to generate a second falling output signal FOUT2. In addition, the second shifter 214 may shift the first rising output signal ROUT1 by one cycle time of the first internal clock signal RCLK to generate a second rising output signal ROUT2. The third shifter 215 may shift the second rising output signal ROUT2 by a half cycle time of the first internal clock signal RCLK to generate a third falling output signal FOUT3. Moreover, the third shifter 215 may shift the second rising output signal ROUT2 by one cycle time of the first internal clock signal RCLK to generate a third rising output signal ROUT3.

The period signal generator 22 may include a first signal synthesizer 221 and a period signal output unit 222. The first signal synthesizer 221 may buffer the first rising output signal ROUT1 to output the buffered signal of the first rising output signal ROUT1 as a first synthetic signal SYN1 while the expansion control signal EXP_CNT is disabled. If the expansion control signal EXP_CNT is enabled, the first signal synthesizer 221 may generate the first synthetic signal SYN1 enabled while at least one of the first and second rising output signals ROUT1 and ROUT2 is enabled. The period signal output unit 222 may output the period signal QSOFF enabled while at least one of the first synthetic signal SYN1 and a third synthetic signal SYN3 is enabled. A detailed configuration and a detailed operation of the first signal synthesizer 221 will be described with reference to FIGS. 5 and 6 below. In addition, a detailed configuration and a detailed operation of the period signal output unit 222 will be described with reference to FIGS. 11 and 12 below.

The first control clock generator 23 may include a second signal synthesizer 231 and a first clock sampler 232. The second signal synthesizer 231 may buffer the second falling output signal FOUT2 to output the buffered signal of the second falling output signal FOUT2 as a second synthetic signal SYN2 while the expansion control signal EXP_CNT is disabled. If the expansion control signal EXP_CNT is enabled, the second signal synthesizer 231 may generate the second synthetic signal SYN2 enabled while at least one of the second and third falling output signals FOUT2 and FOUT3 is enabled. The first clock sampler 232 may buffer the first internal clock signal RCLK to output the buffered signal of the first internal clock signal RCLK as the first control clock signal RCLK_CNT while the second synthetic signal SYN2 is enabled. A detailed configuration and operation of the second signal synthesizer 231 will be described with reference to FIGS. 7 and 8 below.

The second control clock generator 24 may include a third signal synthesizer 241 and a second clock sampler 242. The third signal synthesizer 241 may buffer the second rising output signal ROUT2 to output the buffered signal of the second rising output signal ROUT2 as the third synthetic signal SYN3 while the expansion control signal EXP_CNT is disabled. If the expansion control signal EXP_CNT is enabled, the third signal synthesizer 241 may generate the third synthetic signal SYN3 enabled while at least one of the second and third rising output signals ROUT2 and ROUT3 is enabled. The second clock sampler 242 may buffer the second internal clock signal FCLK to output the buffered signal of the second internal clock signal FCLK as the second control clock signal FCLK_CNT while the third synthetic signal SYN3 is enabled. A detailed configuration and operation of the third signal synthesizer 241 will be described with reference to FIGS. 9 and 10 below.

Figure 3:
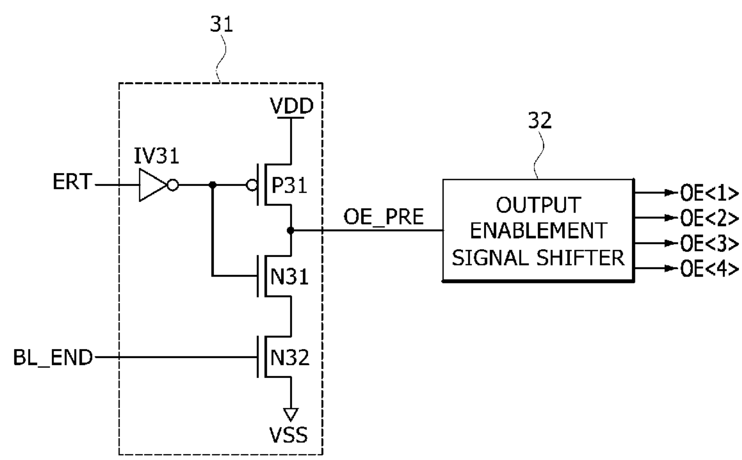
FIG. 3 is a schematic view illustrating an output enablement signal generator included in the output controller of FIG. 2.

Referring to FIG. 3, the output enablement signal generator 211 may include a pre-signal generator 31 and an output enablement signal shifter 32. The pre-signal generator 31 may include an inverter IV31, a PMOS transistor P31, and NMOS transistors N31 and N32. The pre-signal generator 31 may generate a pre-signal OE_PRE enabled to have a logic "high" level during a period from time that the read operation signal ERT is enabled to have a logic "high" level until a time that a burst length termination signal BL_END is enabled to have a logic "high" level, to execute the read operation. The burst length termination signal BL_END may be set to be enabled after the output of data terminates in a read mode, according to information on a burst length stored in the mode register 122. The output enablement signal shifter 32 may sequentially shift the pre-signal OE_PRE to generate the first to fourth output enablement signals OE<1:4>. FIG. 3 also illustrates a power supply voltage VDD and a ground voltage VSS.

Figure 4:
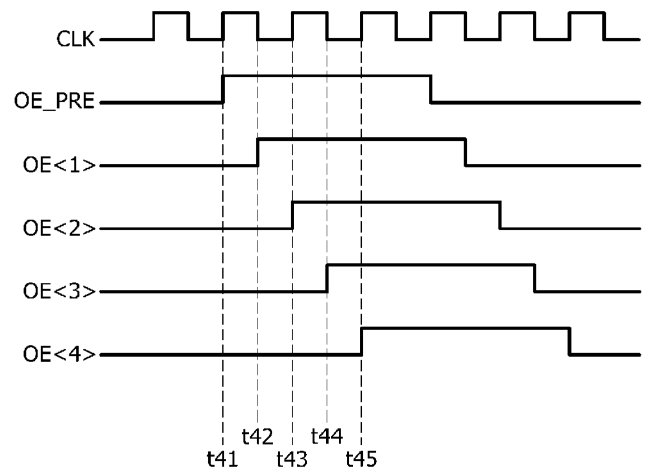
FIG. 4 is a timing diagram illustrating an operation of the output enablement signal generator shown in FIG. 3.

Referring to FIG. 4, the pre-signal OE_PRE may be enabled to have a logic "high" level in synchronization with the read operation signal ERT at time "t41." In addition, the pre-signal OE_PRE may be sequentially shifted to generate the first to fourth output enablement signals OE<1:4>. More specifically, the pre-signal OE_PRE may be shifted by a half cycle time of the clock signal CLK to generate the first output enablement signal OE<1> enabled to have a logic "high" level at time "t42". Further, the first output enablement signal OE<1> may be shifted by a half cycle time of the clock signal CLK to generate the second output enablement signal OE<2> enabled to have a logic "high" level at time "t43." Moreover, the second output enablement signal OE<2> may be shifted by a half cycle time of the clock signal CLK to generate the third output enablement signal OE<3> enabled to have a logic "high" level at time "t44." Further, the third output enablement signal OE<3> may be shifted by a half cycle time of the clock signal CLK to generate the fourth output enablement signal OE<4> enabled to have a logic "high" level at time "t45."

Figure 5:
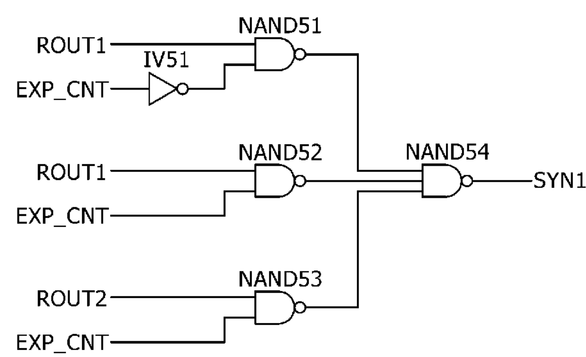
FIG. 5 is a logic circuit diagram illustrating a first signal synthesizer included in the output controller of FIG. 2.

Referring to FIG. 5, the first signal synthesizer 221 may include an inverter IV51 and NAND gates NAND51, NAND52, NAND53 and NAND54. The first signal synthesizer 221 may buffer the first rising output signal ROUT1 using the NAND gates NAND51 and NAND54 to output the buffered signal of the first rising output signal ROUT1 as the first synthetic signal SYN1 while the expansion control signal EXP_CNT is disabled to have a logic "low" level. If the expansion control signal EXP_CNT is enabled to have a logic "high" level, the first signal synthesizer 221 may generate the first synthetic signal SYN1 enabled to have a logic "high" level while at least one of the first and second rising output signals ROUT1 and ROUT2 is enabled to have a logic "high" level.

Figure 6:
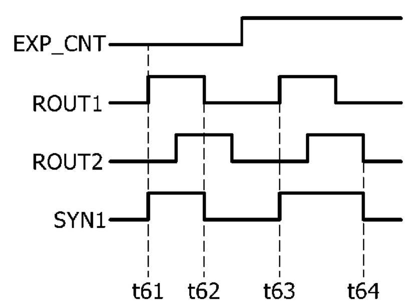
FIG. 6 is a timing diagram illustrating an operation of the first signal synthesizer shown in FIG. 5.

Referring to FIG. 6, while the expansion control signal EXP_CNT is disabled to have a logic "low" level, the first synthetic signal SYN1 may be enabled to have a logic "high" level during a period from time "t61" till time "t62" like the first rising output signal ROUT1. If the expansion control signal EXP_CNT is enabled to have a logic "high" level, the first synthetic signal SYN1 may be enabled to have a logic "high" level during a period from a time "t63" that the first rising output signal ROUT1 is enabled to have a logic "high" level till a time "t64" that the second rising output signal ROUT2 is disabled to have a logic "low" level.

Figure 7:
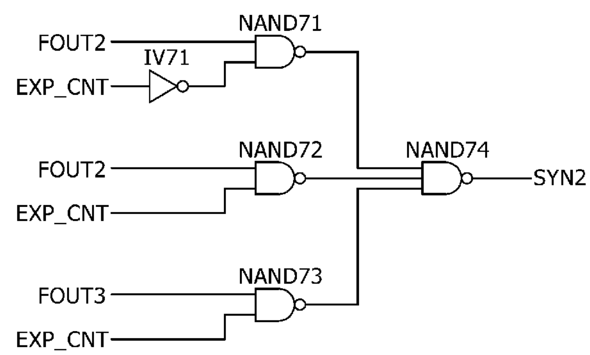
FIG. 7 is a logic circuit diagram illustrating a second signal synthesizer included in the output controller of FIG. 2.

Referring to FIG. 7, the second signal synthesizer 231 may include an inverter IV71 and NAND gates NAND71, NAND72, NAND73 and NAND74. The second signal synthesizer 231 may buffer the second falling output signal FOUT2 using the NAND gates NAND71 and NAND74 to output the buffered signal of the second falling output signal FOUT2 as the second synthetic signal SYN2 while the expansion control signal EXP_CNT is disabled to have a logic "low" level. If the expansion control signal EXP_CNT is enabled to have a logic "high" level, the second signal synthesizer 231 may generate the second synthetic signal SYN2 enabled to have a logic "high" level while at least one of the second and third falling output signals FOUT2 and FOUT3 is enabled to have a logic "high" level.

Figure 8:
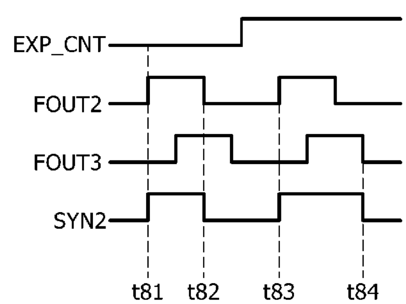
FIG. 8 is a timing diagram illustrating an operation of the second signal synthesizer shown in FIG. 7.

Referring to FIG. 8, while the expansion control signal EXP_CNT is disabled to have a logic "low" level, the second synthetic signal SYN2 may be enabled to have a logic "high" level during a period from time "t81" until time "t82" like the second falling output signal FOUT2. If the expansion control signal EXP_CNT is enabled to have a logic "high" level, the second synthetic signal SYN2 may be enabled to have a logic "high" level during a period from a time "t83" that the second falling output signal FOUT2 is enabled to have a logic "high" level until a time "t84" that the third falling output signal FOUT3 is disabled to have a logic "low" level.

Figure 9:
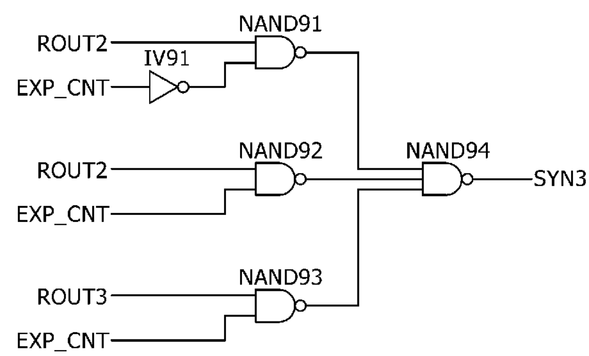
FIG. 9 is a logic circuit diagram illustrating a third signal synthesizer included in the output controller of FIG. 2.

Referring to FIG. 9, the third signal synthesizer 241 may include an inverter IV91 and NAND gates NAND91, NAND92, NAND93 and NAND94. The third signal synthesizer 241 may buffer the second rising output signal ROUT2 using the NAND gates NAND91 and NAND94 to output the buffered signal of the second rising output signal ROUT2 as the third synthetic signal SYN3 while the expansion control signal EXP_CNT is disabled to have a logic "low" level. If the expansion control signal EXP_CNT is enabled to have a logic "high" level, the third signal synthesizer 241 may generate the third synthetic signal SYN3 enabled to have a logic "high" level while at least one of the second and third rising output signals ROUT2 and ROUT3 is enabled to have a logic "high" level.

Figure 10:
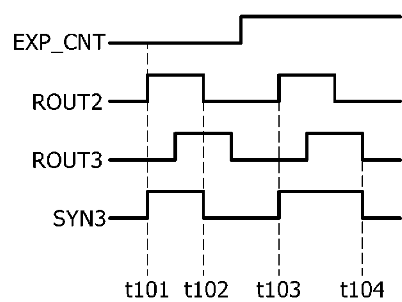
FIG. 10 is a timing diagram illustrating an operation of the third signal synthesizer shown in FIG. 9.

Referring to FIG. 10, while the expansion control signal EXP_CNT is disabled to have a logic "low" level, the third synthetic signal SYN3 may be enabled to have a logic "high" level during a period from a time "t101" till a time "t102" like the second rising output signal ROUT2. If the expansion control signal EXP_CNT is enabled to have a logic "high" level, the third synthetic signal SYN3 may be enabled to have a logic "high" level during a period from a time "t103" that the second rising output signal ROUT2 is enabled to have a logic "high" level until a time "t104" that the third rising output signal ROUT3 is disabled to have a logic "low" level.

Figure 11:
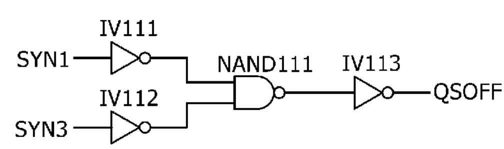
FIG. 11 is a logic circuit diagram illustrating a period signal output unit included in the output controller of FIG. 2.

Referring to FIG. 11, the period signal output unit 222 may include inverters IV111, IV112 and IV113 and a NAND gate NAND111. The period signal output unit 222 may generate the period signal QSOFF disabled to have a logic "low" level if at least one of the first and third synthetic signals SYN1 and SYN3 is enabled to have a logic "high" level.

Figure 12:
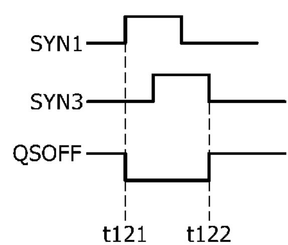
FIG. 12 is a timing diagram illustrating an operation of the period signal output unit shown in FIG. 11.

Referring to FIG. 12, the period signal QSOFF may be generated to have a logic "low" level during a period from a time "t121" until a time "t122," that is, while at least one of the first synthetic signal SYN1 and a third synthetic signal SYN3 is enabled. The period from the time "t121" until the time "t122" may be set as an output period that the first and second control clock signals RCLK_CNT and FCLK_CNT are generated.

Operations of the semiconductor system having the aforementioned configuration will be described with reference to FIGS. 13 and 14 in conjunction with an example in which the expansion control signal EXP_CNT is disabled to have a logic "low" level and an example in which the expansion control signal EXP_CNT is enabled to have a logic "high" level.

Figure 13:
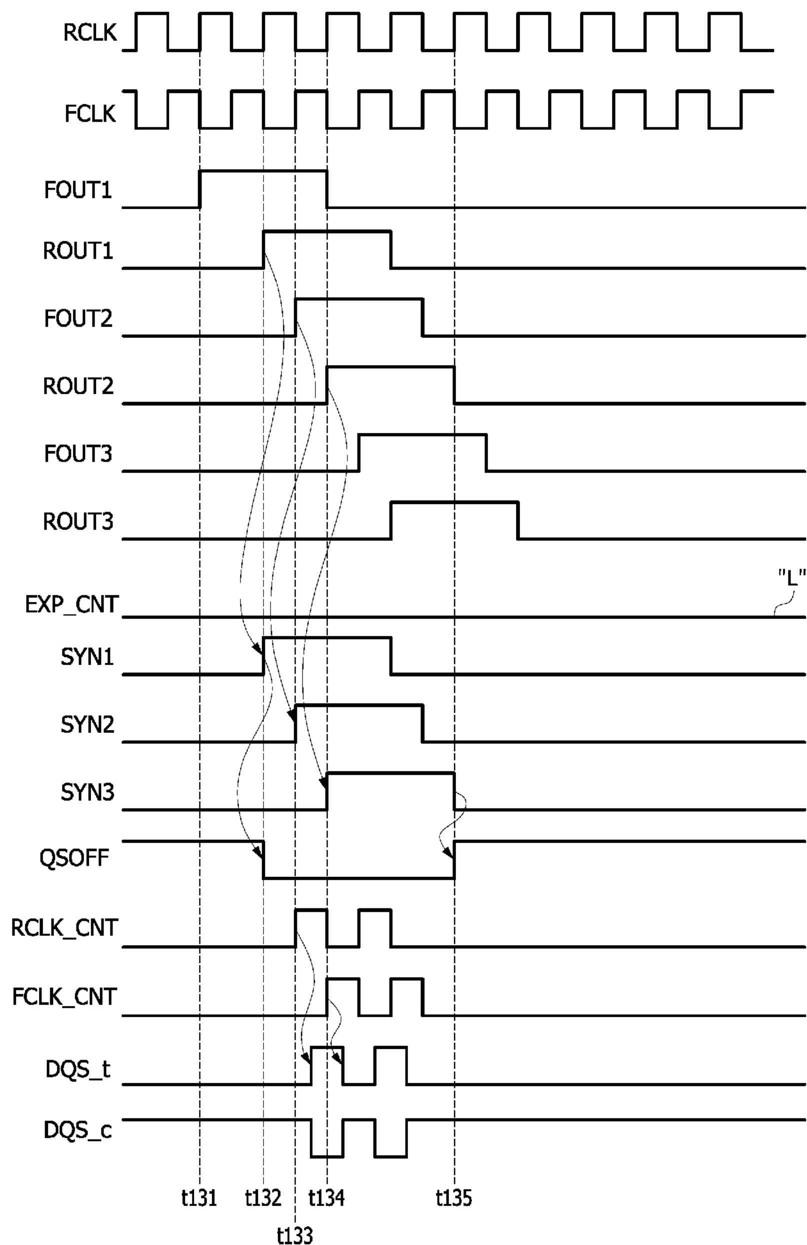
FIGS. 13 and 14 are timing diagrams illustrating operations of the semiconductor system shown in FIG. 1.

Referring to FIG. 13, if the first falling output signal FOUT1 is enabled to have a logic "high" level at a time "t131" while the expansion control signal EXP_CNT is disabled to have a logic "low" level, the first synthetic signal SYN1 may be enabled in synchronization with a rising edge of the first rising output signal ROUT1 at a time "t132." The second synthetic signal SYN2 may be enabled in synchronization with a rising edge of the second falling output signal FOUT2 at a time "t133." Further, the third synthetic signal SYN3 may be enabled in synchronization with a rising edge of the second rising output signal ROUT2 at a time "t134." Accordingly, an output period that the period signal QSOFF is enabled to have a logic "low" level may be set as a period from the time "t132" till a time "t135." Moreover, there is a period that at least one of the first synthetic signal SYN1 and the third synthetic signal SYN3 is enabled to have a logic "high" level. The first and second control clock signals RCLK_CNT and FCLK_CNT may be generated during the output period from the time "t132" until the time "t135." In addition, The first data strobe signal DQS_t, a level of which changes from a logic "low" level to a logic "high" level in synchronization with the first control clock signal RCLK_CNT and changes from a logic "high" level to a logic "low" level in synchronization with the second control clock signal FCLK_CNT, may be generated during the output period from the time "t132" until the time "t135." The second data strobe signal DQS_c may be generated to have an inversed phase of the first data strobe signal DQS_t.

Figure 14:
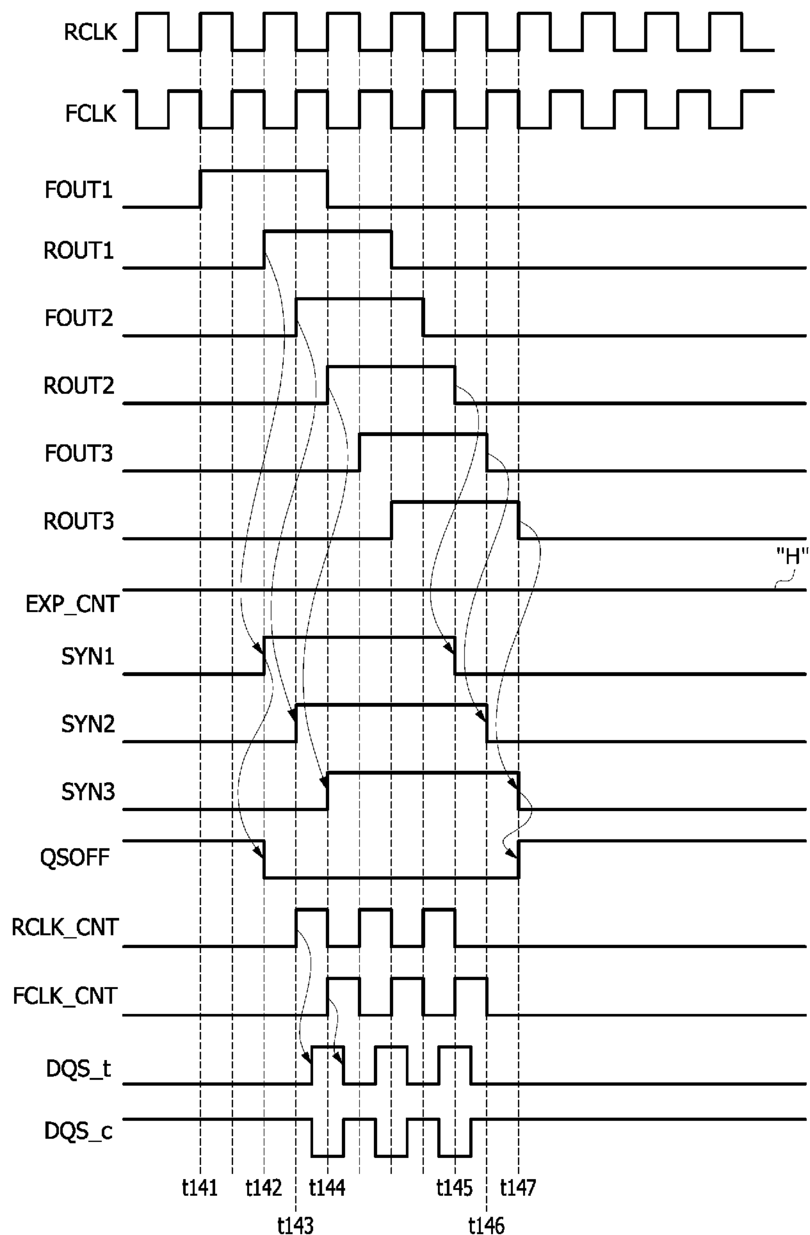

Referring to FIG. 14, if the first falling output signal FOUT1 is enabled to have a logic "high" level at a time "t141" while the expansion control signal EXP_CNT is enabled to have a logic "high" level, the first synthetic signal SYN1 may be enabled in synchronization with a rising edge of the first rising output signal ROUT1 at a time "t142." Further, the first synthetic signal SYN1 may be disabled in synchronization with a falling edge of the second rising output signal ROUT2 at a time "t145." The second synthetic signal SYN2 may be enabled in synchronization with a rising edge of the second falling output signal FOUT2 at a time "t143." The second synthetic signal SYN2 may be disabled in synchronization with a falling edge of the third falling output signal FOUT3 at a time "t146." The third synthetic signal SYN3 may be enabled in synchronization with a rising edge of the second rising output signal ROUT2 at a time "t144." The third synthetic signal SYN3 may be disabled in synchronization with a falling edge of the third rising output signal ROUT3 at a time "t147." Accordingly, an output period that the period signal QSOFF is enabled to have a logic "low" level may be set as a period from the time "t142" until the point of time "t147," that is, a period that at least one of the first synthetic signal SYN1 and the third synthetic signal SYN3 is enabled to have a logic "high" level. The first and second control clock signals RCLK_CNT and FCLK_CNT may be generated during the output period from the time "t142" until the time "t147." In addition, the first data strobe signal DQS_t, a level of which changes from a logic "low" level to a logic "high" level in synchronization with the first control clock signal RCLK_CNT and changes from a logic "high" level to a logic "low" level in synchronization with the second control clock signal FCLK_CNT, may be generated during the output period from the time "t142" until the time "t147." The second data strobe signal DQS_c may be generated to have an inversed phase of the first data strobe signal DQS_t.

As described above, a semiconductor system according to an embodiment may provide a mode capable of expanding an output period that first and second data strobe signals are outputted. More specifically, if an expansion control signal is enabled to have a logic "high" level, the output period that the first and second data strobe signals are outputted may be set to expand by one cycle time of a first or second internal clock signal RCLK or FCLK. If the output period that the first and second data strobe signals are outputted increases, the first and second data strobe signals may be stably generated even at a high operation speed so that data are stably transmitted from a semiconductor device of the semiconductor system to a controller of the semiconductor system.

What is claimed is:

1. A semiconductor system comprising:

a controller suitable for generating a command signal and a clock signal; and a semiconductor device suitable for generating a period signal that sets an output period that a data strobe signal is outputted while a read operation is executed according to the command signal and for generating a control clock signal from which the data strobe signal is obtained during the output period, wherein the output period expands according to an expansion control signal and the data strobe signal is generated in synchronization with the control clock during the output period.

2. The semiconductor system of claim 1, wherein if the expansion control signal is enabled, the output period expands to increase a period time that the control clock signal is generated.

3. The semiconductor system of claim 1, wherein the data strobe signal is transmitted to the controller.

4. The semiconductor system of claim 1, wherein the semiconductor device includes:

an output controller suitable for receiving a read operation signal generated to execute the read operation, an internal clock signal generated in synchronization with the clock signal, and the expansion control signal to generate the period signal and the control clock signal; and a data strobe signal generator suitable for generating the data strobe signal applied to the controller according to the control clock signal while the period signal is enabled.

5. The semiconductor system of claim 4, wherein the internal clock signal includes a first internal clock signal and a second internal clock signal; and wherein the semiconductor device further includes:

a command decoder suitable for decoding the command signal to generate the read operation signal or a mode register write signal;

a mode register suitable for extracting a read latency signal from the command signal and storing the read latency signal according to the mode register write signal and for outputting the read latency signal to the output controller; and an internal clock generator suitable for generating the first and second internal clock signals from the clock signal.

6. The semiconductor system of claim 4, wherein the output controller includes an output signal generator suitable for generating first to third rising output signals and first to third falling output signals according to the read operation signal, a read latency signal and the internal clock signal.

7. The semiconductor system of claim 6, wherein the first rising output signal is generated by shifting the first falling output signal by one cycle time of the internal clock signal;

wherein the second falling output signal is generated by shifting the first rising output signal by a half cycle time of the internal clock signal;

wherein the second rising output signal is generated by shifting the first rising output signal by one cycle time of the internal clock signal;

wherein the third falling output signal is generated by shifting the second rising output signal by a half cycle time of the internal clock signal; and wherein the third rising output signal is generated by shifting the second rising output signal by one cycle time of the internal clock signal.

8. The semiconductor system of claim 6, wherein the output signal generator includes:

an output enablement signal generator suitable for generating an output enablement signal from the read operation signal;

a selector suitable for selectively generating the first falling output signal from the output enablement signal according to the read latency signal;

a first shifter suitable for shifting the first falling output signal in synchronization with the internal clock signal to generate the first rising output signal;

a second shifter suitable for shifting the first rising output signal in synchronization with the internal clock signal to generate the second falling output signal and the second rising output signal; and a third shifter suitable for shifting the second rising output signal in synchronization with the internal clock signal to generate the third falling output signal and the third rising output signal.

9. The semiconductor system of claim 6, wherein the control clock signal includes a first control clock signal and a second control clock signal;

wherein the internal clock signal includes a first internal clock signal and a second internal clock signal; and wherein the output controller further includes:

a period signal generator suitable for generating a first synthetic signal from the first and second rising output signals according to the expansion control signal and for generating the period signal according to the first synthetic signal and a third synthetic signal;

a first control clock generator suitable for generating a second synthetic signal from the second and third falling output signals according to the expansion control signal and for sampling the first internal clock signal generated in synchronization with a rising edge of the clock signal according to the second synthetic signal to generate the first control clock signal; and a second control clock generator suitable for generating the third synthetic signal from the second and third rising output signals according to the expansion control signal and for sampling the second internal clock signal generated in synchronization with a falling edge of the clock signal according to the third synthetic signal to generate the second control clock signal.

10. The semiconductor system of claim 9, wherein the period signal generator includes:

a first signal synthesizer suitable for buffering the first rising output signal to output the buffered signal of the first rising output signal as the first synthetic signal while the expansion control signal is disabled and for generating the first synthetic signal enabled while at least one of the first and second rising output signals is enabled if the expansion control signal is enabled; and a period signal output unit suitable for outputting the period signal enabled while at least one of the first synthetic signal and the third synthetic signal is enabled.

11. The semiconductor system of claim 9, wherein the first control clock generator includes:

a second signal synthesizer suitable for buffering the second falling output signal to output the buffered signal of the second falling output signal as the second synthetic signal while the expansion control signal is disabled and for generating the second synthetic signal enabled while at least one of the second and third falling output signals is enabled if the expansion control signal is enabled; and a first clock sampler suitable for buffering the first internal clock signal to output the buffered signal of the first internal clock signal as the first control clock signal while the second synthetic signal is enabled.

12. The semiconductor system of claim 9, wherein the second control clock generator includes:

a third signal synthesizer suitable for buffering the second rising output signal to output the buffered signal of the second rising output signal as the third synthetic signal while the expansion control signal is disabled and for generating the third synthetic signal enabled while at least one of the second and third rising output signals is enabled if the expansion control signal is enabled; and a second clock sampler suitable for buffering the second internal clock signal to output the buffered signal of the second internal clock signal as the second control clock signal while the third synthetic signal is enabled.

13. A semiconductor device comprising:

an output controller suitable for receiving a read operation signal generated to execute a read operation, an internal clock signal generated in synchronization with a clock signal, and an expansion control signal to generate a period signal and a control clock signal; and a data strobe signal generator suitable for generating a data strobe signal according to the control clock signal during an output period that the period signal is enabled, wherein the period that the period signal is enabled expands according to the expansion control signal and the data strobe signal is generated in synchronization with the control clock during the output period.

14. The semiconductor device of claim 13, a command decoder suitable for decoding a command signal to generate the read operation signal or a mode register write signal;

a mode register suitable for extracting a read latency signal from the command signal and storing the read latency signal according to the mode register write signal and for outputting the read latency signal to the output controller; and an internal clock generator suitable for generating first and second internal clock signals from the clock signal, wherein the first and second internal clock signals are included in the internal clock signal.

15. The semiconductor device of claim 13, wherein the output controller includes an output signal generator suitable for generating first to third rising output signals and first to third falling output signals according to the read operation signal, a read latency signal and the internal clock signal.

16. The semiconductor device of claim 15, wherein the first rising output signal is generated by shifting the first falling output signal by a first one cycle time of the internal clock signal;

wherein the second falling output signal is generated by shifting the first rising output signal by a half cycle time of the internal clock signal;

wherein the second rising output signal is generated by shifting the first rising output signal by a second one cycle time of the internal clock signal;

wherein the third falling output signal is generated by shifting the second rising output signal by an other half cycle time of the internal clock signal; and wherein the third rising output signal is generated by shifting the second rising output signal by a third one cycle time of the internal clock signal.

17. The semiconductor device of claim 15, wherein the output signal generator includes:

an output enablement signal generator suitable for generating an output enablement signal from the read operation signal;

a selector suitable for selectively generating the first falling output signal from the output enablement signal according to the read latency signal;

a first shifter suitable for shifting the first falling output signal in synchronization with the internal clock signal to generate the first rising output signal;

a second shifter suitable for shifting the first rising output signal in synchronization with the internal clock signal to generate the second falling output signal and the second rising output signal; and a third shifter suitable for shifting the second rising output signal in synchronization with the internal clock signal to generate the third falling output signal and the third rising output signal.

18. The semiconductor device of claim 15, wherein the control clock signal includes a first control clock signal and a second control clock signal;

wherein the internal clock signal includes a first internal clock signal and a second internal clock signal; and wherein the output controller further includes:

a period signal generator suitable for generating a first synthetic signal from the first and second rising output signals according to the expansion control signal and for generating the period signal according to the first synthetic signal and a third synthetic signal;

a first control clock generator suitable for generating a second synthetic signal from the second and third falling output signals according to the expansion control signal and for sampling the first internal clock signal generated in synchronization with a rising edge of the clock signal, in response to the second synthetic signal to generate the first control clock signal; and a second control clock generator suitable for generating a third synthetic signal from the second and third rising output signals according to the expansion control signal and for sampling the second internal clock signal generated in synchronization with a falling edge of the clock signal, in response to the third synthetic signal to generate the second control clock signal.

19. The semiconductor device of claim 18, wherein the period signal generator includes:

a first signal synthesizer suitable for buffering the first rising output signal to output the buffered signal of the first rising output signal as the first synthetic signal while the expansion control signal is disabled and for generating the first synthetic signal enabled while at least one of the first and second rising output signals is enabled if the expansion control signal is enabled; and a period signal output unit suitable for outputting the period signal enabled while at least one of the first synthetic signal and the third synthetic signal is enabled.

20. The semiconductor device of claim 19, wherein the first control clock generator includes:

a second signal synthesizer suitable for buffering the second falling output signal to output the buffered signal of the second falling output signal as the second synthetic signal while the expansion control signal is disabled and for generating the second synthetic signal enabled while at least one of the second and third falling output signals is enabled if the expansion control signal is enabled; and a clock sampler suitable for buffering the first internal clock signal to output the buffered signal of the first internal clock signal as the first control clock signal while the second synthetic signal is enabled.

* * * * *